(12) United States Patent
Koontz et al.

(10) Patent No.: US 8,921,992 B2
(45) Date of Patent: Dec. 30, 2014

(54) STACKED WAFER WITH COOLANT CHANNELS

(71) Applicant: Raytheon Company, Waltham, MA (US)

(72) Inventors: Christopher R. Koontz, Manhattan Beach, CA (US); Tse E. Wong, Los Alamitos, CA (US); Jason G. Milne, Hawthorne, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 13/804,902

(22) Filed: Mar. 14, 2013

(65) Prior Publication Data

US 2014/0264759 A1    Sep. 18, 2014

(51) Int. Cl.
*H01L 23/46*    (2006.01)
*H01L 21/50*    (2006.01)

(52) U.S. Cl.
CPC ............... *H01L 23/46* (2013.01); *H01L 21/50* (2013.01)
USPC ........................................................ 257/686

(58) Field of Classification Search
CPC ......... H01L 23/46; H01L 23/42; H01L 23/44; H01L 23/473
USPC ................... 257/606, 612, 613, 686
See application file for complete search history.

(56) References Cited

U.S. PATENT DOCUMENTS

| | | |
|---|---|---|
| 6,190,778 B1 | 2/2001 | Batz-Sohn et al. |
| 6,448,575 B1 | 9/2002 | Slocum et al. |
| 6,500,694 B1 | 12/2002 | Enquist |
| 6,864,585 B2 | 3/2005 | Enquist |
| 7,344,957 B2 | 3/2008 | Barna |
| 7,842,540 B2 | 11/2010 | Tong et al. |
| 7,928,563 B2 * | 4/2011 | Bakir et al. ............. 257/713 |
| 8,004,055 B2 * | 8/2011 | Wells ................. 257/428 |
| 8,030,754 B2 | 10/2011 | Hartwell et al. |
| 8,106,505 B2 | 1/2012 | Bernstein et al. |
| 8,153,505 B2 | 4/2012 | Tong et al. |
| 8,163,373 B2 | 4/2012 | Tong |
| 8,399,984 B2 * | 3/2013 | Kim .................. 257/707 |
| 8,546,930 B2 * | 10/2013 | Bakir et al. ............. 257/686 |
| 8,563,365 B2 * | 10/2013 | King et al. ............. 438/122 |
| 2005/0085018 A1 | 4/2005 | Kim et al. |

(Continued)

OTHER PUBLICATIONS

King et al., Electrical and Fluidic C4 Interconnections for Inter-layer Liquid Cooling of 3D ICs, IEEE, Electronic Components and Technology Conference, 2010, pp. 1674-1681.

(Continued)

*Primary Examiner* — Nathan Ha
(74) *Attorney, Agent, or Firm* — Burns & Levinson LLP; Joseph M. Maraia

(57) ABSTRACT

A wafer assembly with internal fluid channels. The assembly is fabricated by creating one or more channels in a first surface of a first semiconductor wafer and creating an oxide surface on the first surface of the first semiconductor wafer. An oxide surface is also created on a first surface of a second semiconductor wafer. The assembly is fabricated by bonding the oxide surface of the first surface of the first semiconductor wafer to the oxide surface of the first surface of the second semiconductor wafer to create a wafer assembly and to seal the one or more channels at edges defined by the bonded first and second surfaces.

9 Claims, 5 Drawing Sheets

(56) References Cited

U.S. PATENT DOCUMENTS

| | | |
|---|---|---|
| 2005/0269665 A1 | 12/2005 | Wylie et al. |
| 2006/0145356 A1* | 7/2006 | Liu et al. ............... 257/777 |
| 2007/0126103 A1 | 6/2007 | Shi |
| 2008/0179736 A1 | 7/2008 | Hartwell et al. |
| 2009/0072332 A1 | 3/2009 | Dekker et al. |
| 2009/0294954 A1* | 12/2009 | Bakir et al. ............... 257/713 |
| 2010/0155932 A1 | 6/2010 | Gambino et al. |
| 2010/0187682 A1 | 7/2010 | Pinjala et al. |
| 2011/0033958 A1 | 2/2011 | Ohtsuki et al. |
| 2011/0067803 A1 | 3/2011 | Tong et al. |
| 2012/0228779 A1* | 9/2012 | King et al. ............... 257/774 |

OTHER PUBLICATIONS

Dang et al., Integrated Microfluidic Cooling and Interconnects for 2D and 3D Chips, IEEE Transaction on Advanced Packaging, vol. 33, No. 1, Feb. 2010, pp. 79-87.

Xie et al., Electrical-Thermal Co-Simulation of 3D Integrated Systems With Micro-Fluidic Cooling and Joule Heating Effects, IEEE Transactions on Components, Packaging, and Manufacturing Technology, vol. 1, No. 2, Feb. 2011, pp. 234-246.

Zhao et al., Design of On-Chip Microchannel Fluidic Cooling Structures, IEEE, Electronic Components and Technology Conference, 2007, pp. 2017-2023.

* cited by examiner

STACKED WAFER WITH COOLANT CHANNELS

BACKGROUND

Heat densities in electronics continually increase because newer electronics require higher power dissipation and greater packaging density. The trajectory of heat management technology is toward bringing aggressive thermal management to, or into, the chip. Low cost scalable manufacturing of heat exchanger embedded semiconductor devices and chip stacks with reliable mechanical, hydraulic (fluid), and electrical coupling is a key challenge. More specifically, in a 3D semiconductor chip stack, technologies are needed to reliably plumb coolant (leak free) from one die to anther die within the stack and assemble the chip stack.

SUMMARY

The technology described herein relates to fabricating semiconductor assemblies that include effective heat exchanger systems.

One embodiment of the technology is a method of creating a fluid channel in a wafer assembly. The method includes creating one or more channels in a first surface of a first semiconductor wafer. The method also includes creating an oxide surface on the first surface of the first semiconductor wafer. The method also includes creating an oxide surface on a first surface of a second semiconductor wafer. The method also includes bonding the oxide surface of the first surface of the first semiconductor wafer to the oxide surface of the first surface of the second semiconductor wafer to create a wafer assembly and to seal the one or more channels at edges defined by the bonded first and second surfaces.

In some embodiments, the method includes creating one or more channels in the first surface of the second semiconductor wafer that align with the one or more channels in the first surface of the first semiconductor wafer, wherein bonding the oxide surface of the first surface of the first semiconductor wafer to the oxide surface of the first surface of the second semiconductor wafer seals the one or more aligned channels in the first semiconductor wafer and second semiconductor wafer at the edges defined by the bonded first and second surfaces. In some embodiments, the method includes dicing the wafer assembly to produce one or more semiconductor chips, each semiconductor chip including one or more sealed channels.

In some embodiments, an inorganic covalent bondline is created between the oxide surface of the first surface of the first semiconductor wafer and the oxide surface of the second semiconductor wafer by bonding the first and second surfaces. In some embodiments, the method includes creating one or more vias in the first or second semiconductor wafer that are in fluid communication with the one or more channels of the first semiconductor wafer. In some embodiments, each via is a conduit for inputting fluid to, or outputting fluid from, the one or more channels of the wafer assembly.

Another embodiment is a wafer assembly with internal fluid channels. The assembly includes a first semiconductor wafer having a first surface that includes an oxide surface, wherein the first surface of the first semiconductor wafer defines one or more channels. The assembly includes a second semiconductor wafer having a first surface that includes an oxide surface. The oxide surface of the first surface of the first semiconductor wafer is bonded to the oxide surface of the first surface of the second semiconductor wafer to seal the one or more channels at edges defined by the bonded first and second surfaces.

In some embodiments, the first surface of the second semiconductor wafer defines one or more channels that align with the one or more channels in the first surface of the first semiconductor wafer, and wherein the one or more aligned channels in the first semiconductor wafer and second semiconductor wafer are sealed at the edges defined by the bonded first and second surfaces. In some embodiments, the wafer assembly is configured to produce one or more semiconductor chips, each including one or more sealed channels, when the wafer assembly is diced.

In some embodiments, an inorganic covalent bondline is created between the oxide surface of the first surface of the first semiconductor wafer and the oxide surface of the second semiconductor wafer by bonding the first and second surfaces. In some embodiments, the assembly includes one or more vias in the first semiconductor wafer or second semiconductor wafer that are in fluid communication with the one or more channels. In some embodiments, each via is a conduit for inputting fluid to, or outputting fluid from, the one or more channels of the wafer assembly.

Another embodiment is a method of creating a fluid channel in an assembly. The method includes creating one or more channels in a first surface of a first component. The method also includes creating an oxide surface on the first surface of the first component. The method also includes creating an oxide surface on a first surface of a second component. The method also includes bonding the oxide surface of the first surface of the first component to the oxide surface of the first surface of the second component to create an assembly and to seal the one or more channels at edges defined by the bonded first and second surfaces.

In some embodiments, the method includes creating one or more channels in the first surface of the second component that align with the one or more channels in the first surface of the first component, wherein bonding the oxide surface of the first surface of the first component to the oxide surface of the first surface of the second component seals the one or more aligned channels in the first component and second component at the edges defined by the bonded first and second surfaces. In some embodiments, an inorganic covalent bondline is created between the oxide surface of the first surface of the first component and the oxide surface of the second component by bonding the first and second surfaces.

In some embodiments, the method includes creating one or more vias in the first or second component that are in fluid communication with the one or more channels of the first component. In some embodiments, each via is a conduit for inputting fluid to, or outputting fluid from, the one or more channels of the assembly.

Another embodiment is an assembly with internal fluid channels. The assembly includes a first component having a first surface that includes an oxide surface, wherein the first surface of the first component defines one or more channels. The assembly also includes a second component having a first surface that includes an oxide surface. The oxide surface of the first surface of the first component is bonded to the oxide surface of the first surface of the second component to seal the one or more channels at edges defined by the bonded first and second surfaces.

In some embodiments, the first surface of the second component defines one or more channels that align with the one or more channels in the first surface of the first component, and wherein the one or more aligned channels in the first component and second component are sealed at the edges defined by the bonded first and second surfaces. In some embodiments, an inorganic covalent bondline is created between the oxide surface of the first surface of the first component and the oxide surface of the second component by bonding the first and second surfaces.

In some embodiments, the assembly includes one or more vias in the first component or second component that are in fluid communication with the one or more channels. In some embodiments, each via is a conduit for inputting fluid to, or outputting fluid from, the one or more channels of the assembly.

In some embodiments, the technology involves stacked wafer assembly using direct bond hybridization (DBH) to form a covalent bonding between wafers. The micro-channel design is sealed with inorganic covalent bondline, which can achieve the hermetic (or near-hermetic) sealing for the environmental protection and create the desired fluid channels. A thin covalent bondline has less thermal resistance compared to a relatively thicker organic bond. The wafer assembly methods and systems described herein (hereinafter "technology") can provide one or more of the following advantages. One advantage of the technology is that it involves faster and easier construction and assembly processes than conventional methods. Another advantage is that stress-concentration areas are reduced in the fluidic channel which provides better coating coverage surface to achieve a hermetic seal between semiconductor wafers. Another advantage is that fluid channels can be created in a variety of geometries and patterns to achieve high efficient cooling paths with a minimum fluid pressure drop during the fluid cooling circulation. No high-power coolant fluid pumps are required, power consumption is reduced, and low/median pressures are used which minimize leakage concerns. Another advantage is that the fluidic channel can be placed on the back-side of each die (or wafer). Another advantage is that the technology provides uniform and high cooling efficiency through the use of multiple nozzles (e.g., jet impingement nozzles) at various and desirable locations in the fluidic channel. The technology also does not require good thermal conductivity along the normal direction since the heat dissipation is in the in-plane direction.

BRIEF DESCRIPTION OF THE DRAWINGS

The foregoing features of various embodiments of the invention will be more readily understood by reference to the following detailed descriptions in the accompanying drawings.

DETAILED DESCRIPTION OF ILLUSTRATIVE EMBODIMENTS

Semiconductor elements, such as a ball grid array (BGA), can be used as part of aerospace sensor architectures and/or other semiconductor architectures. In most instances, each of the semiconductor elements is soldered to a primary circuit board (e.g., motherboard, array, etc.) creating the semiconductor array. Due to the size, spacing, heat dissipation, and thermal properties of the semiconductor elements on the array, a semiconductor cooling apparatus is needed to quickly and efficiently transfer heat from the array.

Figure 1A:
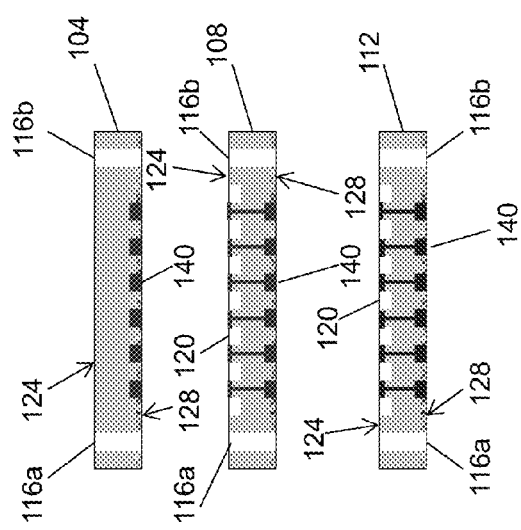
FIG. 1A is a schematic cross-sectional illustration of unassembled components of a wafer assembly.

FIG. 1A is a schematic cross-sectional illustration of unassembled components of a wafer assembly. There are three components 104, 108, and 112. In this embodiment, the components are semiconductor wafers (e.g., silicon semiconductor wafers). However, the concepts and techniques described herein could be applied to other types of components on alternative embodiments, to produce an assembly of the components that has one or more fluid channels that can transport coolant to cool semiconductor elements/components in the assembly. The wafers are generally planar and have a first surface 124 and second, opposing surface 128.

Each of wafers 104, 108, and 112 includes two vias 116a and 116b (generally 116). The vias 116 are open passages that permit fluid (e.g., liquid, gas, 2-phase, or any combination) to flow through the respective wafer (e.g., from one side of the wafer to the opposing side of the wafer, or as conduits for inputting/outputting fluid to/from fluid channels on or within the wafer assembly). In this embodiment, wafers 108 and 112 also include one or more fluid channels 120. The vias 116 are in fluid communication with the channels 120. The vias 116 and channels 120 can be created in the wafers using a variety of semiconductor processing methods. For example, in some embodiments, a series of photolithographic and chemical processes are performed to remove material from a wafer to produce the channels and vias. In some embodiments, an additive process is used to add additional material to a wafer to produce the channels and vias. The wafers 104, 108, and 112 also include electrical interconnects 140 that allow for the wafers to transmit electrical signals (e.g., to electrical components within a given wafer layer and/or between adjacent wafer layers).

Abutting surfaces of the wafers are processed to prepare the wafers for bonding to create the wafer assembly. In this embodiment, the second surface 128 of the wafer 104 is processed to create a smooth surface. Various techniques can be used to create the smooth surface. For example, chemical or mechanical planarization of the wafer surface can be accomplished to produce a smooth surface by polishing, etching, or a combination of the two. In some embodiments, the surface of the wafer is smoothed by exposing the wafer to an abrasive and/or corrosive chemical in conjunction with a polishing pad that is in contact with the wafer surface and is moved relative to the wafer surface. In some embodiments, the surfaces are smoothed to a surface roughness of less than 25 Angstroms (e.g., between 10-25 Angstroms, 5-10 Angstroms, less than 5 Angstroms).

An oxide layer is then formed on the second surface 128 of the wafer. Silicon dioxide is formed on a silicon wafer surface when silicon is exposed to oxygen (or a fluid that includes oxygen (e.g., air)). A thin layer (e.g., 10 Å) of oxide can be formed on the surface when silicon is exposed to air under ambient conditions. Various semiconductor processing technologies are used to create silicon dioxide on silicon surfaces. These technologies typically involve processing the silicon wafer using higher temperatures and different environments (e.g., fluid) to controllably grow layers of silicon dioxide on silicon. For example, temperatures in excess of 600° C. are often used in $O_2$ or $H_2O$ environments. However, 350° C. is often the limit for active silicon wafers to avoid degrading performance of the wafer.

In this embodiment, a planarized oxide surface is similarly created on the first surface 124 and second surface 128 of wafer 108. In addition, a planarized oxide surface is similarly created on the first surface of wafer 112.

Figure 1B:
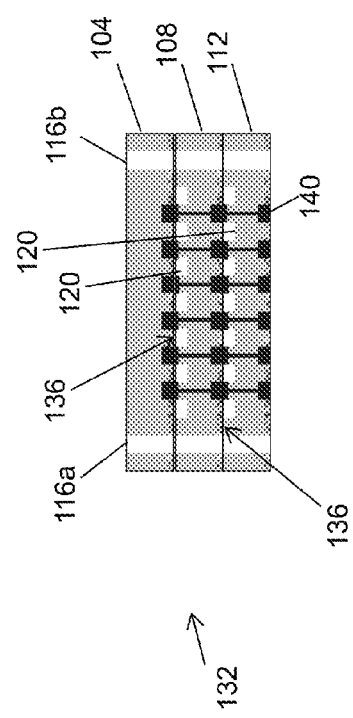
FIG. 1B is a schematic cross-sectional illustration of a wafer assembly fabricated using the components of FIG. 1A, according to an illustrative embodiment.

The wafers 104, 108 and 112 are then bonded together as shown in FIG. 1B to form the wafer assembly. FIG. 1B depicts a cross-sectional view of the assembled wafer assembly 132. The wafers 104, 108, and 112 are bonded together by bringing their planarized oxide surfaces into contact with each other to create an inorganic covalent bondline 136 (e.g., a bondline of about 1 μm) between the planarized oxide surfaces of the wafers 104, 108, and 112. The covalent bondline is generally thinner and has less thermal resistance than the organic bonds currently used to join wafers together in a conventional wafer assembly. Because the covalent bond is relatively thin (e.g., thinner than solder bumps and underfill), electronic components can be spaced much more closely on the wafer. In addition, fluid interconnects can be placed on the wafers with much higher spacing density.

The organic bonds also require the addition of barrier layers prior to applying the organic bond to insure that the bonds are strong. The technology described herein does not require the use of additional barrier layers. Conventional organic bonds used in underfilling attachment of individual dies together is performed after individual chips/dies have been excised from an array; whereas the technology described herein permits the bonding to be performed at the wafer level. In some embodiments, the covalent bondlines are 10 times thinner than an organic bondline.

The bonding process also seals the channels 120 at the edges 136 defined by the bonded surfaces of the wafers. Sealing the edges 136 can create a hermetic seal. The wafers 104, 108, and 112 can be bonded by bringing their surfaces together in the absence of any external pressure. However, in some embodiments, additional pressure is applied to force the surfaces into contact with each other to reduce the possibility that any gaps remain between the surfaces.

The channels 120 in the wafer assembly are sealed as a result of the bonding process. Fluid can be introduced into the channels 120 by the vias 116 that are in fluid communication with the channels 120.

Figure 1C:
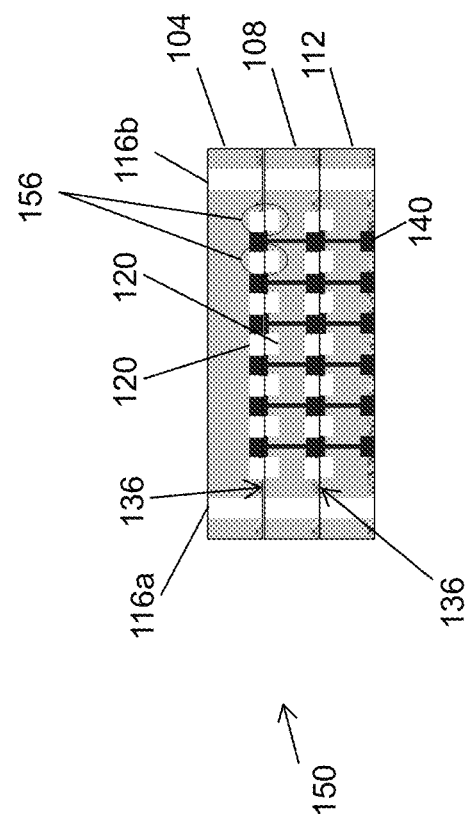
FIG. 1C is a schematic cross-sectional illustration of a wafer assembly, according to an illustrative embodiment.

In some embodiments, channels 120 are provided in both the first surface 124 of wafer 108 and the second surface 128 of wafer 104. The channels 120, in combination, form larger sealed channels 156 when the wafers are bonded together to form wafer assembly 150 (as shown in an alternative embodiment in FIG. 1C).

Figure 2:
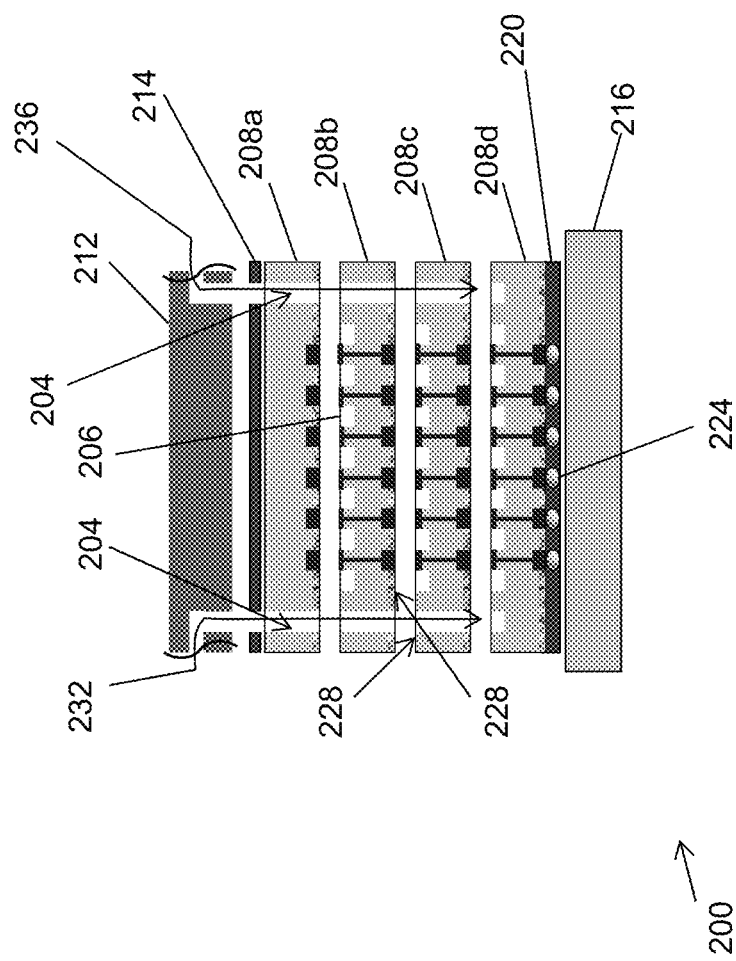
FIG. 2 is a schematic cross-sectional illustration of an exploded view of a wafer assembly with internal fluid channels, according to an illustrative embodiment.

FIG. 2 is a schematic cross-sectional illustration of an exploded view of a wafer assembly 200 with internal fluid channels 206 and fluid vias 204, according to an illustrative embodiment. The assembly 200 includes four wafers 208a, 208b, 208c, and 208d (generally 208), a semiconductor lid or cap 212, a lid/cap attach layer 214, and a substrate 216. Wafer 208d is electrically and mechanically coupled to the substrate 216 via an adhesive underfill 220 that includes a plurality of solder ball bonds 224. The solder ball bonds 224 electrically couple wafer 208d to the substrate 216 which, for example, enables electrical signals to be passed to and from the wafers in the wafer assembly 200 via the substrate 216.

The abutting surfaces of the wafers 208 in the assembly are prepared with a planarized oxide surface (similarly as described with respect to, for example, FIGS. 1A and 1B) prior to bonding the wafers 208 together. In addition, the abutting surfaces of the lid 212, lid attach layer 214 and substrate 216 are similarly prepared so all the components (i.e., lid 212, lid attach layer 214, substrate 216 and wafers 208) are bonded together to form the assembly 200. The edges 228 of all the components are sealed by the bonding process performed. In this embodiment, the fluid vias 204 of the lid 212 are configured for inputting fluid 232 to the wafer assembly 200 and for outputting fluid 236 from the wafer assembly 200.

Figure 3:
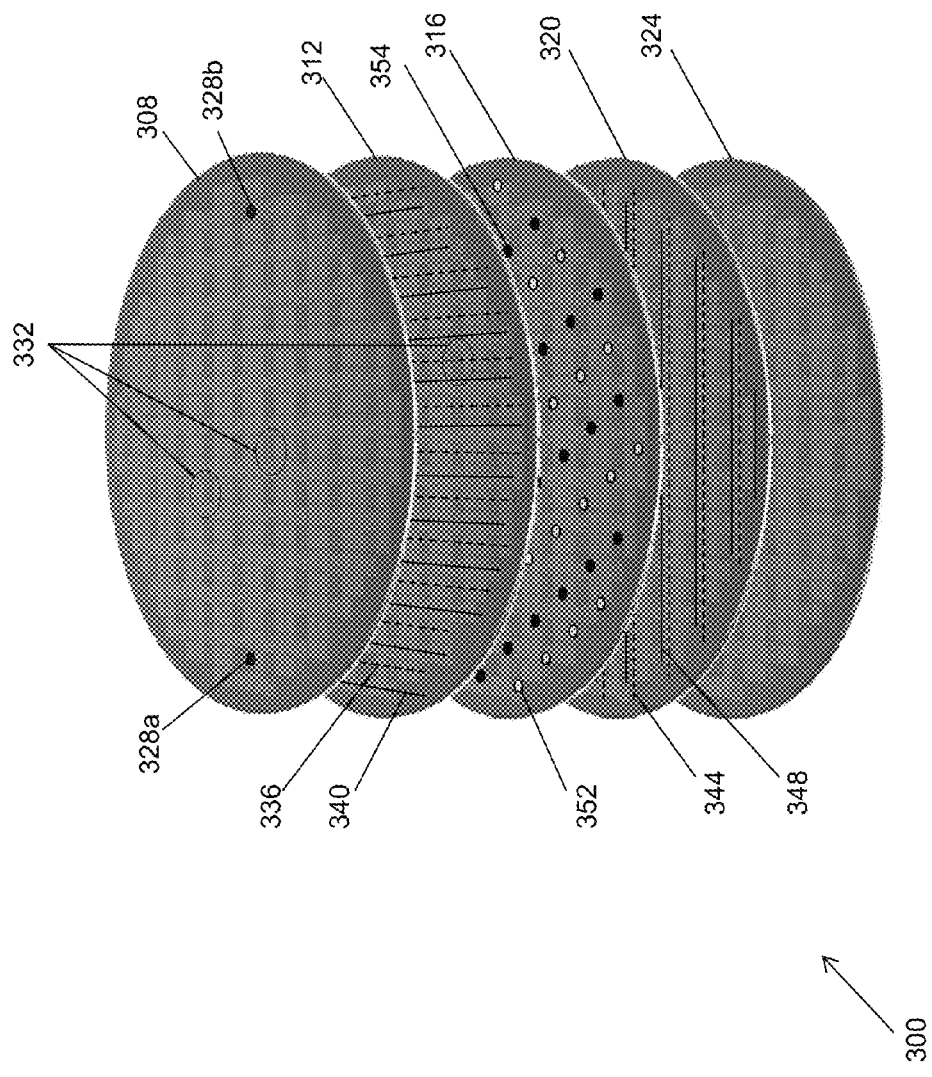
FIG. 3 is a schematic illustration of an exploded view of a wafer assembly with internal channels and vias, according to an illustrative embodiment.

FIG. 3 is a schematic illustration of an exploded view of a wafer assembly 300 with internal channels and vias, according to an illustrative embodiment. The assembly 300 includes five semiconductor wafers 308, 312, 316, 320, and 324. The wafers (308, 312, 316, 320, and 324) are bonded together, similarly as described herein with respect to FIGS. 1A, 1B, and 2. The wafers include various integrated circuit components and traces 332 configured to perform one or more functions. Wafer 308 includes two vias 328a and 328b (generally 328). Via 328a is an input conduit for inputting fluid to the assembly 300. Via 328b is an output conduit for outputting fluid from the assembly 300.

Wafer 312 includes a plurality of fluid channels etched or otherwise formed in the top surface of the wafer 312. Fluid channels 336 (illustrated using a dashed line) are connected to the input via 328a to receive a coolant. The coolant flows through the channels 336 to cool the components and traces 332 during subsequent operation of the wafer assembly 300. The coolant flowing through channels 336 of wafer 312 is then conveyed to fluid channels 344 (illustrated using a dashed line) of wafer 320 through the vias 352 of wafer 316. The coolant then cools the components and traces 332 in wafer 320 during subsequent operation of the wafer assembly 300.

Fluid channels 348 (illustrated as solid lines) in wafer 320 are fluid output channels that direct the coolant flowing through channels 348 to vias 354 of wafer 316. The vias 354 direct the heated coolant to fluid channels 340 (illustrated as solid lines) of wafer 312. The heated coolant is then directed to via 328b of wafer 308 to be output from the wafer assembly 300 to, for example, be chilled again in a coolant chiller for subsequent reuse.

Figure 4:
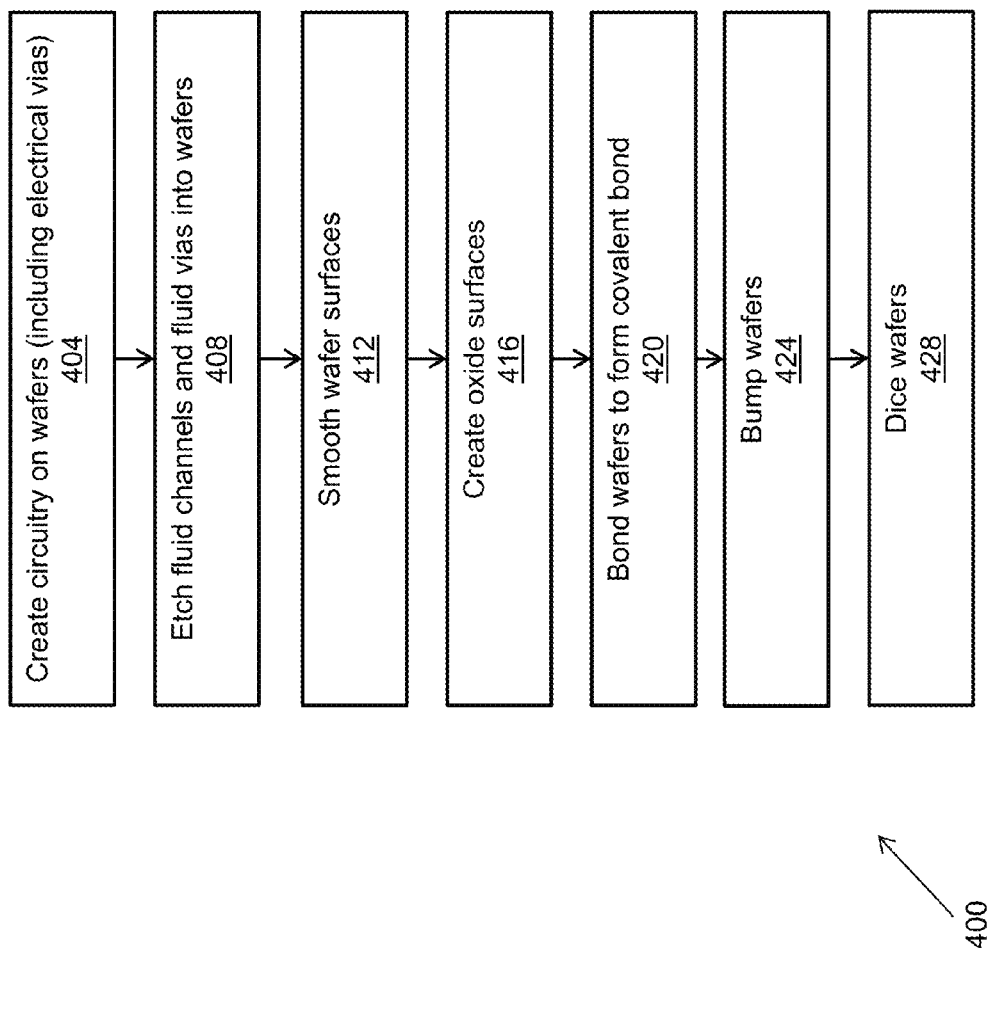
FIG. 4 is a flowchart of a method for creating fluid channels in an assembly, according to an illustrative embodiment.

FIG. 4 is a flowchart 400 of a method for creating fluid channels in an assembly (e.g., the wafer assembly 200 of FIG. 2). The method includes creating circuitry (e.g., traces, components, electrical vias) on semiconductor wafers (step 404) to be used in manufacturing a wafer assembly (e.g., the assembly 200 of FIG. 2). The method also includes etching fluid channels and fluid vias into the wafers (step 408). For example, in the assembly 200 of FIG. 2, the channels 206 and the vias 204 are etched into the wafers. The method also includes creating smooth surfaces (step 412) on the wafers (for example, similarly as described above with respect to FIGS. 1A and 1B).

The method also includes creating oxide surfaces on abutting surfaces of the wafers (step 416) to prepare the wafer surfaces for bonding (for example, similarly as described above with respect to FIGS. 1A and 1B). The method also includes bonding the wafers together (step 420) by, for example, positioning the wafers so the prepared, oxide surfaces are in contact with each other so the surfaces will form a covalent bond. The wafer assembly has been created when the wafers are bonded together.

The method also includes bumping the wafer assembly (step 424). Bumping is a semiconductor packaging technique that attaches solder balls to bond pads on the semiconductor dies within a wafer assembly. The wafers are then diced (step 428) to produce individual chips from the semiconductor wafer assembly. The chips each include one or more sealed fluid channels. When a chip is installed in an electronic device, a fluid input and fluid output is coupled to the chip to supply coolant to the chip during operation, to cool the chip.

Comprise, include, and/or plural forms of each are open ended and include the listed parts and can include additional parts that are not listed. And/or is open ended and includes one or more of the listed parts and combinations of the listed parts.

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes that come within the meaning and range of equivalency of the claims are therefore intended to be embraced therein.

The invention claimed is:

1. A wafer assembly with internal fluid channels, the assembly comprising:
    a first semiconductor wafer having a first surface that includes a first oxide surface, wherein the first surface of the first semiconductor wafer defines one or more channels; and
    a second semiconductor wafer having a first surface that includes a second oxide surface,
    wherein the first oxide surface of the first surface of the first semiconductor wafer is bonded to the second oxide surface of the first surface of the second semiconductor wafer to seal the one or more channels at edges defined by the bonded first and second oxide surfaces, such that an inorganic covalent bondline is created between the first and second oxide surfaces.

2. The assembly of claim 1, wherein the first surface of the second semiconductor wafer defines one or more channels that align with the one or more channels in the first surface of the first semiconductor wafer, and wherein the one or more aligned channels in the first semiconductor wafer and second semiconductor wafer are sealed at the edges defined by the bonded first and second oxide surfaces.

3. The assembly of claim 1, wherein the wafer assembly is configured to produce one or more semiconductor chips, each including one or more sealed channels, when the wafer assembly is diced.

4. The assembly of claim 1, comprising one or more vias in the first semiconductor wafer or second semiconductor wafer that are in fluid communication with the one or more channels.

5. The assembly of claim 4, wherein each via is a conduit for inputting fluid to, or outputting fluid from, the one or more channels of the wafer assembly.

6. An assembly with internal fluid channels, the assembly comprising:
    a first component having a first surface that includes a first oxide surface, wherein the first surface of the first component defines one or more channels; and
    a second component having a first surface that includes a second oxide surface,
    wherein the first oxide surface of the first surface of the first component is bonded to the second oxide surface of the first surface of the second component to seal the one or more channels at edges defined by the bonded first and second oxide surfaces, such that an inorganic covalent bondline is created between the first and second oxide surfaces.

7. The assembly of claim 6, wherein the first surface of the second component defines one or more channels that align with the one or more channels in the first surface of the first component, and wherein the one or more aligned channels in the first component and second component are sealed at the edges defined by the bonded first and second oxide surfaces.

8. The assembly of claim 6, comprising one or more vias in the first component or second component that are in fluid communication with the one or more channels.

9. The assembly of claim 8, wherein each via is a conduit for inputting fluid to, or outputting fluid from, the one or more channels of the assembly.

* * * * *